United States Patent
Patland et al.

(10) Patent No.: US 6,943,546 B2
(45) Date of Patent: Sep. 13, 2005

(54) MAGNETORESISTIVE ELEMENT LIFECYCLE TESTER

(75) Inventors: Henry Patland, Los Gatos, CA (US); Wade A. Ogle, San Jose, CA (US)

(73) Assignee: Infinitum Solutions, Inc., Santa Clara, CA (US)

( * ) Notice: Subject to any disclaimer, the term of this patent is extended or adjusted under 35 U.S.C. 154(b) by 248 days.

(21) Appl. No.: 10/418,382

(22) Filed: Apr. 17, 2003

(65) Prior Publication Data

US 2004/0207393 A1 Oct. 21, 2004

(51) Int. Cl.⁷ .................................................. G01R 33/18
(52) U.S. Cl. ..................................... 324/210; 324/209
(58) Field of Search ................................ 324/209–210, 324/224, 235, 760; 73/862.041, 862.046, 779, 862.193, 862.69, 866.5; 360/313, 328

(56) References Cited

U.S. PATENT DOCUMENTS 5,670,889 A * 9/1997 Okubo et al. ............... 324/760

OTHER PUBLICATIONS

Advanced Probing System, Inc., "Effects of 'On the Shelf' Probe Tip Oxidation on Contact Resistance", Technical Bulletin—Jul. 1999, 1 page.

* cited by examiner

*Primary Examiner*—Jay Patidar
*Assistant Examiner*—Reena Aurora
(74) *Attorney, Agent, or Firm*—Silicon Valley Patent Group LLP

(57) ABSTRACT

A lifecycle analyzer includes a heating element for heating a plurality of magnetoresistive (MR) elements, which maybe, e.g., in bar form. At one location the MR elements are in contact with a stress probe card for applying a bias voltage or current stress. The MR elements are moved to a separate location, where there is a test probe card and magnetic field generator for testing the MR elements after being stressed. In one embodiment, a subset of the plurality of MR elements is tested at a time. The lifecycle analyzer includes an in-situ abrasive element that is used to abrade the probe pins of the stress probe card to remove oxidation that results from extended contact with the heated MR elements.

24 Claims, 3 Drawing Sheets

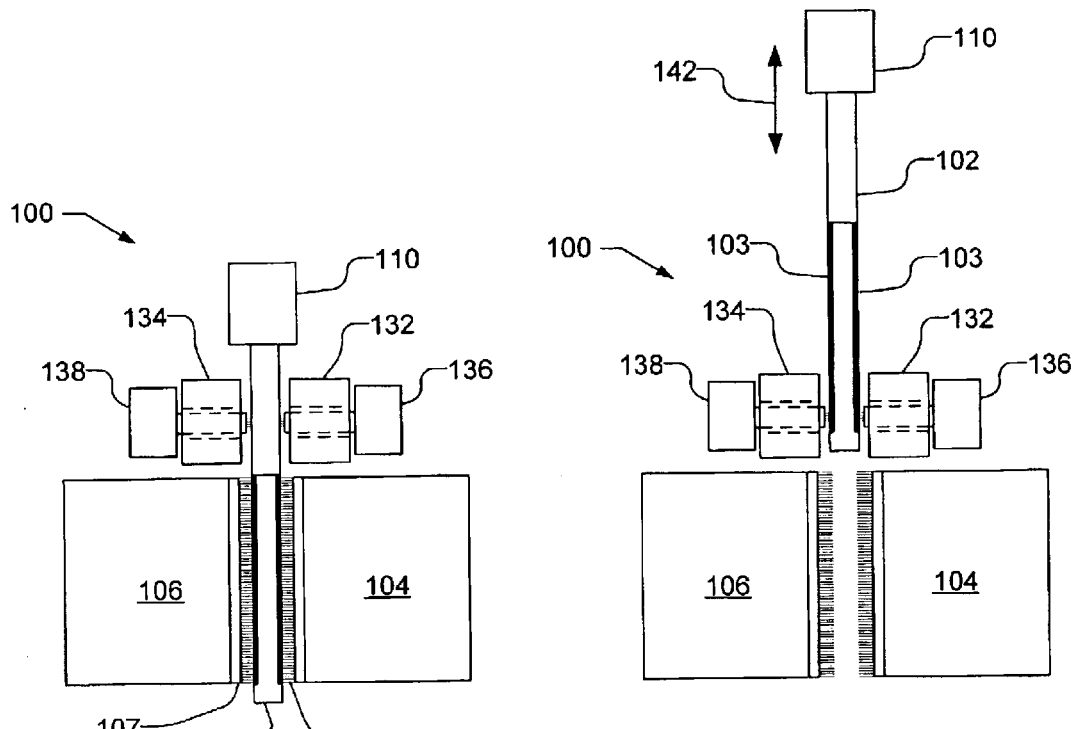
Fig. 3A
Fig. 3B
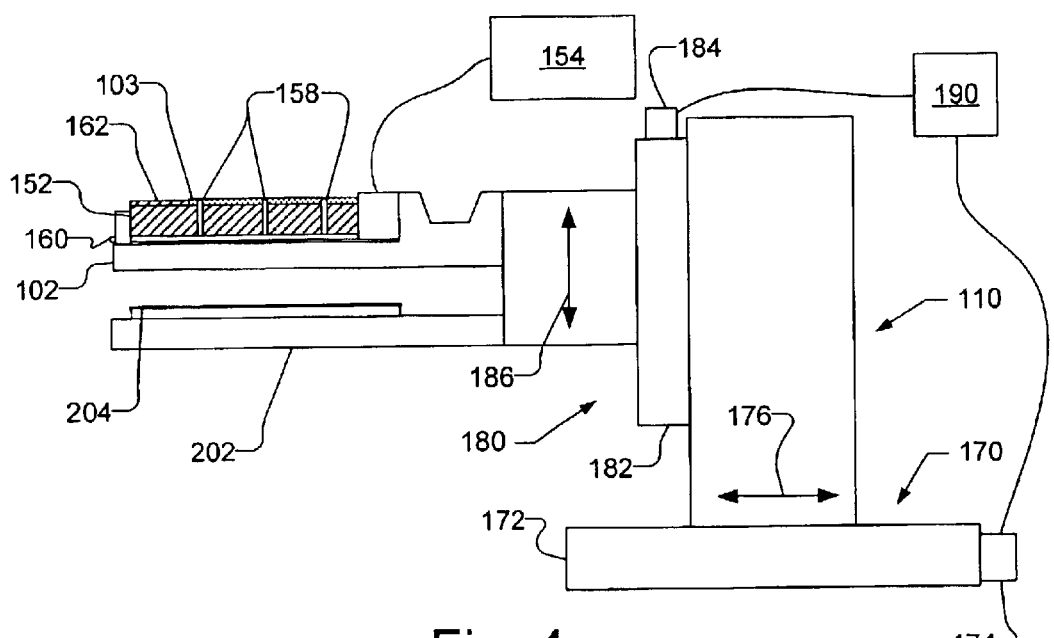
Fig. 4

MAGNETORESISTIVE ELEMENT LIFECYCLE TESTER

BACKGROUND OF THE INVENTION

1. Field of the Invention

The present invention relates to testing a thin-film magnetic heads with a magnetoresistive effect (MR) elements and in particular to testing multiple MR elements that are placed under long term thermal stress.

2. Discussion of the Related Art

It is desirable to test the lifecycle of magnetoresistive (MR) elements to ensure long term adequate performance. Generally, testing the lifecycle of MR elements includes stressing MR elements with an increased ambient temperature while applying bias current to the MR element and/or write element.

In one type of conventional lifecycle testing, the MR elements are stressed and tested in an environment with a raised ambient temperature, i.e., in an oven. Typically, in an oven tests, a number of MR elements are connected to a bias current source, the MR elements are heated and the resistance in the MR elements is tested.

Resistance measurements of MR elements, however, is a relatively crude assessment of the MR elements performance. In general, a more thorough analysis of the performance of the MR elements is desirable. By way of example, MR elements can be more thoroughly analyzed using Quasistatic tests such as, Amplitude, Asymmetry, Barkhausen Jump, Spectral Maximum Amplitude Noise (SMAN), and Popcorn Noise, which are well known in the art. Quasistatic tests are performed within a magnetic field, and typically require a short cable connection, e.g., 2 to 3 inches, to the MR element. Oven tests, on the other hand, do not include magnetic fields and use relatively large connections, e.g., 2 feet.

Another conventional lifecycle test is performed at the head gimbal assembly (HGA) level, i.e., where the MR head is mounted on the HGA and can include Quasistatic testing. Testing at the HGA level is advantageous because it can be done within the magnetic fields and uses short cable connections. During testing, the MR heads are placed on a heating block and the bias and writing stresses can be applied through the HGA. Typically, HGA lifecycle testing is performed on 1 to 8 heads at a time. Current technology, however, limits the tests to a maximum of approximately 8 heads due to size constraints of magnetic fields and short cable connects. Thus, if a large data sample is desired, many testers are required. Further, HGA level tests are late in the manufacturing process, i.e., the processing of the MR heads must be completed and the heads mounted on the head gimbal assembly prior to testing.

Thus, what is needed is a lifecycle tester that can perform Quasistatic tests on many MR elements simultaneously early in the process.

SUMMARY

In accordance with an embodiment of the present invention, a tester includes a heating element that is capable of heating a plurality of magnetoresistive (MR) elements in bar form. In one embodiment, the MR elements are moved between a stress location, in which the MR elements are placed in contact with a stress probe card for applying a bias voltage or current stress, and a test location, in which the MR elements are placed in contact with a test probe card within a magnetic field. In another embodiment, the tester includes an in-situ abrasive element that is used to abrade the probe pins of the stress probe card to remove oxidation that results from extended contact with the heated MR elements.

In accordance with one aspect of the present invention, an apparatus for stressing and testing a plurality of MR elements includes at least one stress probe card having a plurality of probe pins and a heater element for providing a heat stress to the plurality of MR elements. The apparatus further includes at least one magnetic field generator and at least one test probe card having a plurality of probe pins, the pins of the test probe card being positioned within the magnetic field produced by the magnetic field generator. The apparatus has a positioning system that places the MR elements in contact with the probe pins of the stress probe card and for placing the MR elements in contact with the probe pins of the test probe card. In one embodiment, the positioning system may move the MR elements between the stress probe card and the test probe card. In some embodiments two stress probe cards and two test probe cards are used to contact two separate sets of MR elements, which may be in, e.g., bar form.

Another aspect of the present invention includes a method of stressing and testing a plurality of MR elements. The method includes heating the MR elements and providing a bias stress to the heated MR elements at a first location, moving the MR elements to a second location and testing the MR elements at the second location.

In another aspect of the present invention, an apparatus includes a heater element for providing a heat stress to a plurality of MR elements and at least one probe card having a plurality of pins that are removably coupled to the MR elements, the probe card applying at least a bias stress to the MR elements while a heat stress is applied to the MR elements. The apparatus further includes an abrasive element and at least one actuator for placing the abrasive element and the pins of the probe card in contact and to abrade the pins with the abrasive element.

In yet another aspect of the present invention, a method includes heating a plurality of MR elements, placing a plurality of probe pins in contact with the MR elements, and applying one of a bias current and a bias voltage to the MR elements. The method further includes disengaging the plurality of probe pins from the MR elements, abrading the plurality of probe pins, replacing the plurality of probe pins in contact with the MR elements, and reapplying one of a bias current and a bias voltage to the heated MR elements.

BRIEF DESCRIPTION OF THE DRAWINGS

FIGS. 3A and 3B illustrate top views of the tester, with a bar held in the stress location and in the test location, respectively.

FIG. 4 illustrates a side view of the bar heater arm and the scrubbing arm and the positioning system.

DETAILED DESCRIPTION

Figure 1:
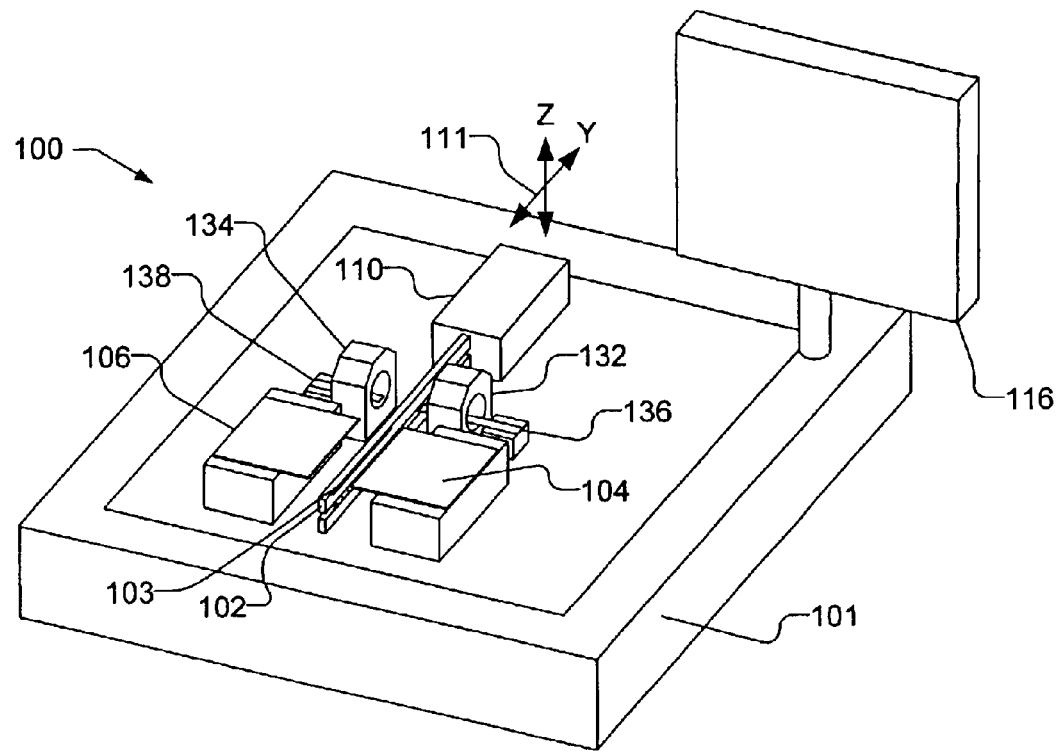
FIG. 1 is an isometric view of a lifecycle tester, in accordance with an embodiment of the present invention.

FIG. 1 is an isometric view of a lifecycle tester 100 that may be used to stress and test a plurality of MR elements, in accordance with an embodiment of the present invention.

Figure 2:
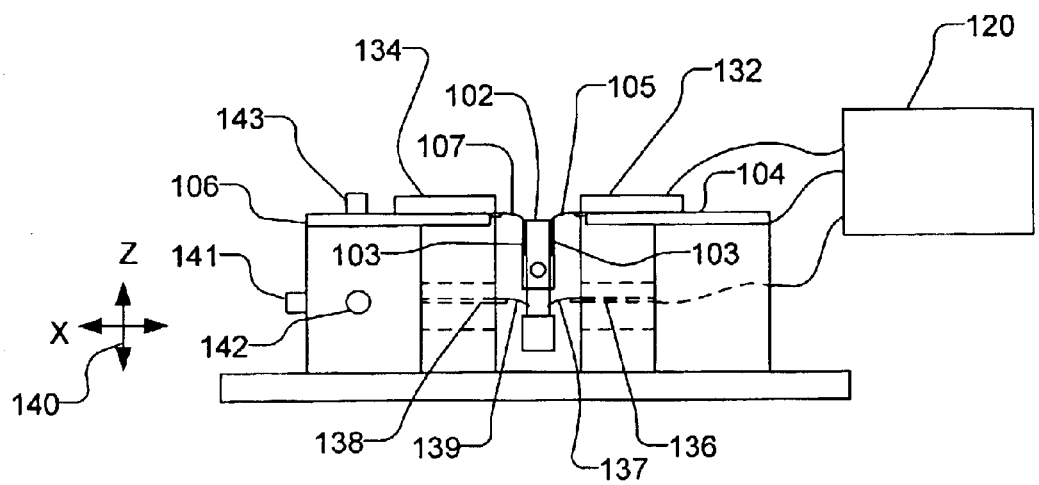
FIG. 2 is a front view of a portion of the tester.

The MR elements that are stressed and tested with tester 100 before the MR elements are sliced into individual elements, e.g., at bar level. FIG. 2 is a front view of a portion of tester 100. Tester 100 may be used to provide stress to MR elements for an extended period of time and to test the performance of the stressed MR heads over time.

Tester 100 includes an isolation table 101, upon which is a bar heater arm 102. One or two bars 103 may be held and heated by the bar heater arm 102. The bar heater arm 102 includes a heating element that may be heated, e.g., between 50° and 150° C., or any other desired range. As can be seen in FIG. 2, tester 100 can be used to simultaneously test two bars 103. Of course, if desired, only one bar need be tested at a time.

Tester 100 further includes stress probe cards 104 and 106. The stress probe cards may be manufactured by, e.g., SV Probe, Inc. located in San Jose, Calif. Each stress probe card 104 and 106 includes 184 probe pins, collectively 105 and 107, which are manufactured, e.g., from NewTek-Probes™. The probe pins are not shown in FIG. 1 for clarity. The geometry of the probes, such as bend angles of the tips and placement in the epoxy rings, is determined to achieve a desired balanced contact force, i.e., the force applied by the probes as they are deflected, which is, e.g., 2.0 grams per mil, where the probe pins 105 and 107 have a 1.5 mil tip diameter. Because of the heating and consequential expansion of the bar, the probe tip dimensions are centered on the contact pads on a bar that is at the target temperature, e.g., 100° C. By centering the probe tip on the contact pads, the probe pins will be able to accommodate a range of temperatures, e.g., ±50° C., depending on the expansion coefficient of the bar and the dimensions of the contact pads. The probe cards are manufactured with a high temperature epoxy to withstand the elevated temperature.

The stress probe cards 104 and 106 are coupled to a processor 120, which controls the stress probe cards to provide a bias stress to the MR elements on the bar 103 and, if desired, a write stress, to some write elements adjacent to MR elements. Processor 120 may be, e.g., a Pentium III™ processor with 20 GB drive and 256 MB RAM, with a Win98™ or Win2000™ operating system, or other suitable system. Processor 120 may control stress probe cards 104 and 106 to apply the same stresses to each MR element or to provide different stresses to individual or groups of MR elements.

The stress read bias, for example, may have 96 independent channels that may operate in true current or voltage bias modes. By way of example, the range of current bias may be ±20, 10, and 5 mA with a resolution of 9.8, 4.9, and 2.45 µA. The range of voltage bias may be ±1, 0.5, and 0.25 V, with a resolution of 0.49, 0.24, 0.12 V. The bias may selectably be turned off during write.

The write stress may have 16 independent channels. By way of example, the write current range may be 16.5 to 72 mA bp, with a current resolution of 1.8 mA. The frequency range may be 12.5 to 200 MHz with a 1 MHz resolution. Up to 16 channels may be simultaneously written and the system is DC write capable.

Controlling a bias current and/or voltage and write current may be done through software control of processor 120 and is well within the abilities of those of ordinary skill in the art.

In one embodiment, the stress bias (and write stress) may be selectable turned off to an MR element or group of MR elements, which is particularly advantageous if the MR element or group of MR elements is failing faster than other elements on the bar 103.

In operation, the bar 103 may be stressed for an extended period of time prior to testing. For example, the bar heater arm 102 may heat the bar 103 to, e.g., 100° C., while bias stress is applied to the MR elements, and if desired, a write stress is applied to some or all write elements. After a period of time, e.g., minutes to hours, the MR elements are then tested. The process of stressing and testing the bars may be repeated for any desired amount of time, e.g., days to weeks.

As illustrated in FIG. 1, a positioning system 110 is provided to move the bar heater arm 102 between the stress probe cards 104 and 106 to the test location. The positioning system 110 includes Y and Z actuators, indicated by arrows 111.

The test location includes at least one magnetic field generator, such as electromagnetic coils 132 and 134. Electromagnetic coils 132 and 134 may be, e.g., Helmholtz coils with windings, for producing an external magnetic field that is applied to the MR elements under test. A power supply (not shown), which is connected to and controlled by processor 120, is connected to the electromagnetic coils 132 and 134 and provides the excitation current to the electromagnetic coils.

Extending through the electromagnetic coils 132 and 134 are test probe cards 136 and 138. Each test probe card 136 and 138 includes four or eight probe pins, collectively 137 and 139, which are used to test one MR element per bar at a time. Test probe cards 136 and 138 may be similar to stress probe cards 104 and 106, but with fewer probe pins. Additionally, where 8 probe pins are used for Kelvinized measurement, i.e., 4 point probing, the tip diameter of the probe pins may be, e.g., 1 mil.

Test probe cards 136 and 138 are coupled to processor 120, which controls the test and stores the resulting data. The tests performed on the MR elements may be conventional write and MR resistance measurements well known in the art. Additional tests may also be used, such as those performed by the Blazer X5B manufactured by Integral Solutions, Int'l, located in San Jose, Calif. Additional tests that may be performed on the MR elements are described in more detail in U.S. Patent Application entitled "Magnetic Head Tester" having application Ser. No. 10/177,333, filed on Jun. 21, 2002, having the same assignee as the present disclosure and which is incorporated herein by reference.

The results of the testing may be displayed, e.g., on a monitor 116, shown in FIG. 1, that is coupled to the processor 120, shown in FIG. 2.

FIGS. 3A and 3B illustrate top views of tester 100, with the bar heater arm 102 holding the bars 103 in the stress location and in the test location, respectively. The positioning system 110 moves the bars 103 from the stress probe cards 104 and 106 to the test probe cards 136 and 138 by lowering the bars 103, along the Z axis (shown in FIG. 1), and moving the bars 103 in a direction parallel to the bar, i.e., along the Y axis, as indicated by arrow 142, then raising the bars 103 along the Z axis. Once the bar 103 is at the test location, the electromagnetic coils 132 and 134 generate the desired magnetic field and each MR element on each bar is individually tested, with positioning system 110 moving the bar 103 so that each MR element may be tested.

When two bars 103 are installed into arm 102 of tester 100, care must be taken to properly align the stress probe cards 104 and 106 so that all the probe pins 105 and 107 simultaneously contact the desired MR elements on the bars 103. By way of example, stress probe card 104 may be stationary, while stress probe card 106 is movable in the X, Y and Z directions as indicated by arrows 140 in FIG. 2 and arrows 111 in FIG. 1, using, e.g., positioning screws 141, 142, and 143 in FIG. 2. The test probe cards 136 and 138 are likewise adjusted with respect to each other. Moreover, the test probe cards 136 and 138 should be adjusted in the X direction with respect to the stress probe cards 104 and 106 so that tester 100 can move the bars 103 between the stress probe cards 104, 106 and the test probe cards 136, 138 without requiring movement in the X direction.

It should be understood that other mechanisms may be employed to transport the bar from the stress probe cards to the test probe cards. By way of example, it should be understood, that the present invention may use any relative motion between the bar and the probe cards. For example, if desired the bar may be held stationary and the stress probe cards and test probe cards may be moved. Alternatively, both the bar and at least one of the stress probe cards and the test probe cards may be moved.

FIG. 4 illustrates a side view of the bar heater arm 102 with a bar 103 mounted thereon and the positioning system 110. Bar heater arm 102 includes a heater block 152, which is, e.g., a copper or copper alloy block with a layer of vitreous carbon applied by chemical vapor deposition (CVD). The bar 103 is mounted with air bearing surface (ABS) and MR elements toward and pressed into contact with the heater element. Thus, a thermally conductive but electrically insulating material, such as vitreous carbon, is useful conducting heat to the MR elements without shorting the MR elements.

Embedded in the heater block 152 is a heater and sensor, which are coupled to a temperature controller, shown schematically as block 154. A closed loop temperature control is used. By way of example, the heater and sensor may be purchased from Lake Shore Cryotronics, Inc. of Westerville Ohio as the 50 Watt Cartridge Heater HTR-50 and the Platinum Resistance Sensor PT-103, respectively. The temperature controller may likewise be purchased from Lake Shore Cryotronics, Inc. as the LS-331 Temperature Controller.

The heater block 152 is mounted on arm 102 with insulating ceramic washers disposed between the heater block 152 and the arm 102. A plurality of clamps 158 press the bar 103 against the heater block 152. Clamps 158 are opened and closed, e.g., via a screw mechanism 160. The clamps 158 hold bars 103 against the heater block 152, but allow for lateral expansion of the bars 103 due to heating. Heater block 152 includes an indentation 162 along each side at the upper surface to accommodate the bars 103. The indentation 162 includes a hardstop and has sufficient length to accommodate different length bars, e.g., 30 to 100 mm length bars, plus any heating expansion of the bars. The hardstop in the indentation 162 allows the bars 103 to be loaded in a known position.

The arm 102 is coupled to the positioning system 110, which includes a Y actuator 170 and a Z actuator 180. The Y actuator 170 includes a precision stage 172 and a linear motor 174 that moves the arm 102 along the Y direction, as indicated by arrow 176. By way of example, the Y stage 172 may be manufactured by IKO International, Inc. as part number TU 50S 36/1X SG5E149, which has a linear accuracy of 0.008 mm, a positioning accuracy of 0.020 mm, and a repeatability of +/−0.002 mm. Because only a portion of the full stroke is required while probing the bar 103 during testing, the absolute positioning accuracy for probing the bar is 0.005 mm or better. The Y motor 174 may be a Pacific Scientific stepper motor with 800 count encoder, part number M22NR-XBJDN-HHOO.

The Z actuator 180 similarly includes a precision stage 182 and a linear motor 184, which move the arm 102 in the Z direction, as indicated by arrow 186. By way of example, the Z stage 182 may be manufactured by THK as part number KR2001A-100LP0-1700, which has a linear accuracy of 0.010 mm, positioning accuracy of 0.020 mm, and a repeatability of +/−0.003 mm. The Z motor 184 may be, e.g., an Applied Motion Products motor, part number HT17-075-D with US Digital Encoder (800 count), part number E5S-200-197-ITH.

The motors in the positioning system 110 are controlled by a motor driver 190, which may also be coupled to the processor 120 shown in FIG. 1. By way of example, the motor driver may be manufactured by API Controls, located in Rockford, Ill., as the P325 Series Low EMI Microstep Drive model.

As discussed above, the bar 103 is stressed with bias stress (and write stress) as well as with elevated temperature via the heater block 152. The inventors discovered that due to the elevated temperature of the bar 103 and the amount of time that the probe pins 105 and 107 are in contact with the heated bar 103, the probe pins 105 and 107 will become oxidized. Oxidation creates increased contact resistance, which interferes with the application of the desired bias and write stresses. The oxidation occurs quickly relative to the length of a typical lifecycle test, which may last a month. For example, a significant amount of oxidation may occur after a few days of stressing the bar 103.

Thus, in accordance with another embodiment of the present invention, tester 100 includes an abrasive element, such as abrasive pad 204, that is used to abrasively clean the probe pins, in situ, of oxide or any other particles. By removing oxide, the probe pins are able to make better contact with the MR elements (and write elements). The abrasive pad 204 may be used to clean both the probe pins 105 and 107 of the stress probe cards 104 and 106 as well as the probe pins 137 and 139 of the testing probe cards 136 and 138, but test probe pins generally need to be cleaned less frequently the stress probe pins.

Abrasive pad 204 may be bonded to the top of a scrubbing arm 202, which is coupled to heater arm 102 and, thus, is advantageously controlled by positioning system 110. Abrasive pad 204 may be, e.g., an aluminum oxide or diamond lapping plate. By way of example, the abrasive pad 204 may be a lapping film manufactured by 3M as 266X Imperial™ or diamond lapping plate 6MB1.

During cleaning the abrasive pad 204 is pressed against the probe pins 105 and 107, via the Z actuator 180, and the scrubbing arm 204 is moved back and forth in the Y direction, approximately 8 mil, via the Y actuator 170, for, e.g., 5 cycles.

It should be understood that other mechanisms may be employed to abrade the probe pins 105, 107. For example, it not necessary that the abrasive pad 204 is coupled to or controlled by the same positioning system as arm 102. Thus, if desired additional actuators may be employed to abrade the probe pins with the abrasive pad 204. Further, it should be understood that the present invention may use any relative motion between the abrasive pad 204 and the probe cards. For example, if desired the abrasive pad may be held stationary and the stress probe cards may be moved. Alternatively, both the abrasive pad 204 and the probe cards may be moved. Further, it should be understood that the abrading pad may contact less than all the probe pins at a time. For example, the abrading pin may contact a single probe pin at a time. Accordingly, all probe pins or a subset of all the probe pins may be abraded at any one time.

Figure 5A:
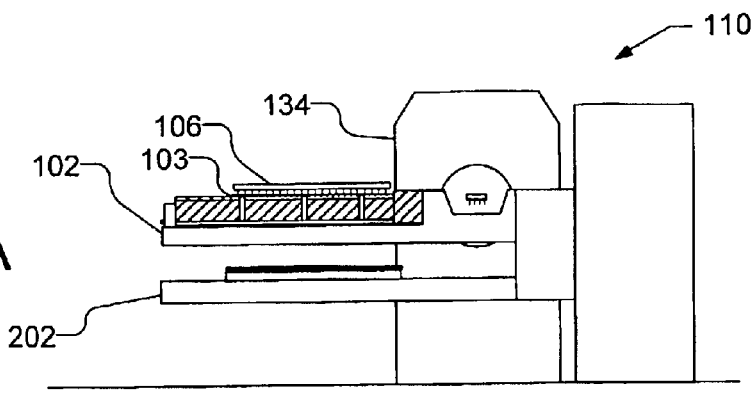
FIGS. 5A, 5B, 5C, and 5D illustrate side views of a portion of tester with the arm holding a bar in various positions.
Figure 5B:
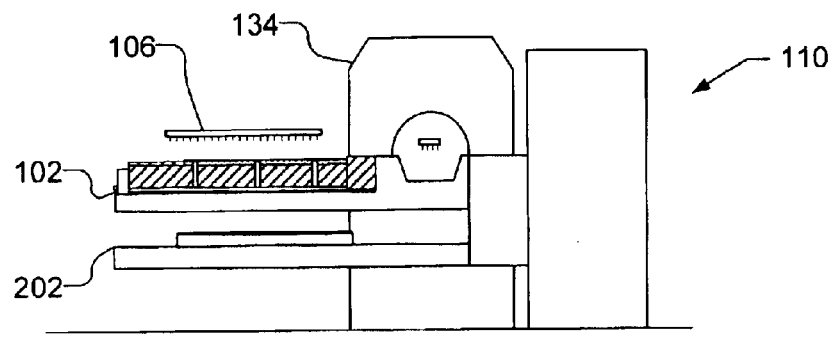

FIGS. 5A, 5B, 5C, and 5D illustrate side views of a portion of tester 100 with the arms 102 and 202 in various positions. It should be understood that stress probe card 104, test probe card 136 and electromagnetic coil 132, are not shown in FIGS. 5A–5D for the sake of clarity. Moreover, the individual Y and Z actuators are not shown in FIGS. 5A–5D for the sake of simplicity. FIG. 5A illustrates a side view of arm 102 positioned to place bar 103 in contact with the stress probe card 106. As illustrated in FIG. 5B, the positioning system 110 moves arm 102 downward to disengage the bar 103 from the stress probe card 106.

Figure 5C:
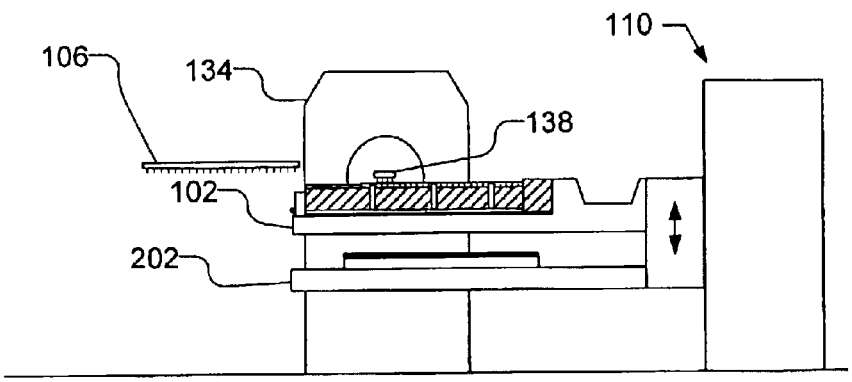

FIG. 5C illustrates the arm 102 positioned to place bar 103 in contact with the test probe card 138 which extends through the center of the electromagnetic coil 134. To test an MR element on the bar 103, the arm 102 moves the bar 103 under and then upwards to engage the MR element with the test probe card 138. To disengage, the arm 102 moves downward and then laterally to position the next MR element under the test probe card 138. Thus, a subset, e.g., 1, of all the MR elements is tested incrementally. When the testing of the MR elements is complete, the arm 102 may move back to engage the bar 103 with the stress probe card 106. As can be seen in FIG. 5C, the test probe card 138 is at a different height than the stress probe card 106 so that the entire length of the bar 103 may be tested by test probe card 138 without interference from the stress probe card 106.

In one embodiment, the tester 110 uses the measured resistance values from the stress probe cards 104, 106, and the test probe cards 136, 138, to determine when there is contact between the probe pins and the bar 103. Thus, for example, when placing a bar 103 in contact with the probe pins on the stress probe card, the Z actuator 180 raises the arm 102 until the stress probe card measures a decreased resistance, indicating that the probe pins are in contact with the bar 103. The Z actuator 180 may continue to raise the arm 102 by a predetermined amount, e.g., 3 mil, to apply the desired contact force between the probe pins and the MR elements. The vertical position of the bar 103 with respect to the test probe cards may likewise be determined based on measured resistance.

It should be understood that because MR elements are sensitive to electrostatic discharge, prior to engaging or disengaging contact between the bar 103 and either the stress probe cards or the test probe cards, the probe pins are grounded.

Figure 5D:
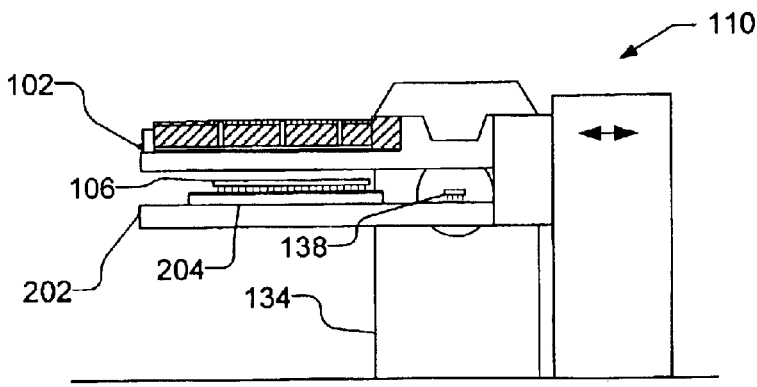

FIG. 5D illustrates the abrasive pad 204 positioned in contact with the probe pins 107 of the stress probe card 106. Once the desired contact is made between the abrasive pad 204 and the probe pins, the positioning system 110 moves arm 102 back and forth in the Y direction by, e.g., 8 mil, for the desired scrubbing cycles. To engage the abrasive pad 204 with the probe pins, the positioning system moves in the Y direction until the end of arm 102 and scrubbing arm 202 are beyond the test probe cards. The positioning system 110 then moves the arm 102 vertically and then laterally to place the stress probe cards between the arm 102 and scrubbing arm 202. The positioning system 110 then raises the arm 102 until the abrasive pad 204 makes the desired contact with the pins of the stress probe card 106. The pins of the test probe card 138 can be similarly cleaned.

In one embodiment, contact between the scrubbing arm and the probe pins can be determined by the resistance measurement from the probe pins, particularly where the abrasive pad 204 uses an electrically conductive material (such as a diamond lapping plate). Alternatively, the height of the probe pins may be predetermined and the abrasive pad 204 is then moved to that predetermined height.

Although the invention has been described with reference to particular embodiments, the description is only an example of the invention's application and should not be taken as a limitation. For example, while the MR elements are described herein as being at the bar level, other levels, including wafer level, or form factors may be used tested in accordance with the present invention. Various other adaptations and combinations of features of the embodiments disclosed are within the scope of the invention as defined by the following claims.

What is claimed is:

1. An apparatus for stressing and testing a plurality of magnetoresistive elements, the apparatus comprising:
   at least one stress probe card having a plurality of probe pins;
   a heater element for providing a heat stress to the plurality of magnetoresistive elements;
   at least one magnetic field generator;
   at least one test probe card having a plurality of probe pins, the probe pins of the test probe card being positioned within the magnetic field produced by the magnetic field generator; and
   a positioning system for placing the magnetoresistive elements in contact with the probe pins of the stress probe card and for placing the magnetoresistive elements in contact with the probe pins of the test probe card.

2. The apparatus of claim 1, wherein the plurality of magnetoresistive elements are on a bar, the apparatus further comprising an arm coupled to the heater element, wherein the bar is removably mounted to the heater element, wherein the arm is coupled to the positioning system, the positioning system moving the bar between the stress probe card and the test probe card.

3. The apparatus of claim 1, wherein the plurality of magnetoresistive elements are on two bars, the apparatus comprising:
   two stress probe cards each having a plurality of probe pins;
   two test probe cards each having a plurality of probe pins, each test probe card positioned within the magnetic fields produced by the magnetic field generators; and
   wherein the positioning system places the magnetoresistive elements on each bar with probe pins of a respective stress probe card and places the magnetoresistive elements on each bar with probe pins of a respective test probe card.

4. The apparatus of claim 2, wherein the positioning system comprises:
   a first actuator coupled to the arm that moves the bar along a vertical axis; and
   a second actuator coupled to the arm that moves the bar along a horizontal axis parallel with bar.

5. The apparatus of claim 1, further comprising an abrasive element and at least one actuator that places the abrasive element and at least one probe pin of the stress probe card in contact.

6. The apparatus of claim 5, wherein the positioning system for placing the magnetoresistive elements in contact with the probe pins of the stress probe card and for placing the magnetoresistive elements in contact with the probe pins of the test probe cards includes said at least one actuator.

7. The apparatus of claim 5, wherein at least one actuator places the abrasive element and at least one probe pin of the test probe card in contact.

8. The apparatus of claim 5, further comprising:

a heater arm holding the heater element; and a scrubbing arm coupled to the heater arm, the abrasive element being mounted to the scrubbing arm;

wherein the heater arm and scrubbing arm are coupled to the positioning system.

9. An apparatus comprising:

a heater element for providing a heat stress to a plurality of magnetoresistive elements;

at least one probe card having a plurality of pins that are removably coupled to the magnetoresistive elements, the probe card applying at least a bias stress to the magnetoresistive elements while a heat stress is applied to the magnetoresistive elements;

an abrasive element; and at least one actuator for placing the abrasive element and at least one pin of the probe card in contact and to abrade the at least one pin with the abrasive element.

10. The apparatus of claim 9, further comprising:

a heater arm to which is mounted the heater element; and a scrubbing arm to which is mounted the abrasive element;

wherein the heater arm and scrubbing arm are coupled to the at least one actuator.

11. The apparatus of claim 9, wherein the at least one actuator is a first actuator that moves the abrasive element on a vertical axis and a second actuator that moves the abrasive element on a horizontal axis.

12. The apparatus of claim 9, wherein the at least one probe card further applies a write stress to at least one write element that is adjacent to at least one magnetoresistive element.

13. The apparatus of claim 9, further comprising at least one magnetic field generator for producing a magnetic field when the magnetoresistive elements are under test.

14. The apparatus of claim 13, further comprising at least one test probe card that measures at least one parameter of a magnetoresistive element.

15. A method of stressing and testing a plurality of magnetoresistive elements, the method comprising:

heating the magnetoresistive elements and providing a bias stress to the heated magnetoresistive elements at a first location;

moving the magnetoresistive elements to a second location; and testing the magnetoresistive elements at the second location.

16. The method of claim 15, wherein providing a bias stress to the heated magnetoresistive elements comprises:

placing a plurality of probe pins in contact with the magnetoresistive elements; and applying one of a bias current and a bias voltage to the magnetoresistive elements.

17. The method of claim 16, further comprising stressing the magnetoresistive elements by providing a write current to a write element.

18. The method of claim 16, wherein moving the magnetoresistive elements to a second location comprises:

disengaging the plurality of probe pins from the magnetoresistive elements; and moving the magnetoresistive elements to a test location.

19. The method of claim 16, wherein testing the magnetoresistive elements at the second location comprises:

placing a second plurality of probe pins in contact with at least one magnetoresistive element;

generating a magnetic field around the at least one magnetoresistive element; and measuring at least one parameter from the at least one magnetoresistive element while in the magnetic field.

20. The method of claim 16, further comprising:

abrading at least one of the plurality of probe pins;

placing the plurality of probe pins in contact with the magnetoresistive elements after abrading the at least one of the plurality of probe pins; and applying one of a bias current and a bias voltage to the heated magnetoresistive elements.

21. The method of claim 15, wherein testing the magnetoresistive elements at the second location is performed while heating the magnetoresistive elements.

22. The method of claim 15, wherein a subset of the plurality of magnetoresistive elements is tested at a time.

23. A method comprising:

heating a plurality of magnetoresistive elements;

placing a plurality of probe pins in contact with the magnetoresistive elements;

applying one of a bias current and a bias voltage to the magnetoresistive elements;

disengaging the plurality of probe pins from the magnetoresistive elements;

abrading at least one of the plurality of probe pins;

placing the plurality of probe pins in contact with the magnetoresistive elements after abrading the at least one of the plurality of probe pins; and reapplying one of a bias current and a bias voltage to the heated magnetoresistive elements.

24. The method of claim 23, wherein abrading the at least one of the plurality of probe pins comprises:

placing an abrasive element in contact with at least one probe pin; and moving the abrasive element while the abrasive element is in contact with the probe pin.

* * * * *